United States Patent [19]

Mizuhashi et al.

[11] Patent Number: 4,485,146

[45] Date of Patent: Nov. 27, 1984

[54] GLASS BODY PROVIDED WITH AN ALKALI DIFFUSION-PREVENTING SILICON OXIDE LAYER

[75] Inventors: Mamoru Mizuhashi; Yoshio Gotoh, both of Yokohama, Japan

[73] Assignee: Asahi Glass Company Ltd, Tokyo, Japan

[21] Appl. No.: 403,282

[22] Filed: Jul. 29, 1982

[30] Foreign Application Priority Data

Aug. 6, 1981 [JP] Japan ................................ 56-122421

[51] Int. Cl.$^3$ ............................................... B32B 9/00
[52] U.S. Cl. .................................... 428/428; 428/446
[58] Field of Search ....................... 428/428, 426, 446

[56] References Cited

U.S. PATENT DOCUMENTS

| | | | |
|---|---|---|---|
| 4,144,684 | 3/1979 | Kirkbride et al. | 428/428 |
| 4,180,618 | 12/1979 | Alpha et al. | 428/428 |
| 4,188,444 | 2/1980 | Landau | 428/428 |
| 4,188,452 | 2/1980 | Groth | 428/428 |
| 4,202,928 | 5/1980 | Staebler | 428/428 |

Primary Examiner—Marion E. McCamish
Assistant Examiner—E. Rollins Buffalow
Attorney, Agent, or Firm—Oblon, Fisher, Spivak, McClelland & Maier

[57] ABSTRACT

A glass body comprising an alkali-containing glass substrate and a silicon oxide layer formed on its surface for preventing diffusion of alkali metal ions from the glass substrate. Said silicon oxide layer contains hydrogen bonded to silicon.

2 Claims, No Drawings

GLASS BODY PROVIDED WITH AN ALKALI DIFFUSION-PREVENTING SILICON OXIDE LAYER

BACKGROUND OF THE INVENTION

1. FIELD OF THE INVENTION

The present invention relates to an improvement of a glass body comprising an alkali-containing glass substrate and a silica layer formed thereon to prevent diffusion of alkali metal ions from the glass substrate.

2. DESCRIPTION OF THE PRIOR ART

Glass plates as transparent material are chemically stable and have superior surface hardness, and they are durable at a high temperature at a level of 500° to 700° C. and superior in their electric insulating property and optical property. Accordingly, they are widely used not only as window materials for architectural structures, vehicles or aircrafts, but also for optical elements or electric or electronic elements. Recently, electroconductive glass plates in which an electroconductive coating is formed on a glass plate, have been used for display devices such as liquid crystal device, an electrochromic device and an electric field luminance device, or an amorphous solar cell substrate. As a glass substrate for these electroconductive glass plates, a soda lime silica glass plate is most commonly used as it is relatively inexpensive. However, the soda lime silica glass plate contains from about 10 to 20% by weight of an alkali metal component such as sodium or potassium, and has a drawback such that when used for an extended period of time, alkali metal ions tend to diffuse from the glass substrate to its surface, thereby leading to degradation of the property of the coated electroconductive layer. For instance, it is likely that white turbidity will be formed in the electroconductive layer of the electroconductive glass plate, the transparency of the layer will be lowered, the electric resistance of the electroconductive layer will be increased or the physicochemical durability will be reduced.

Furthermore, in the case of a liquid crystal display device, an oxidation-reduction reaction will be caused at the surface of the display electrode by the alkali metal ions diffused from the glass, whereby the transparent electrode material i.e. an indium oxide layer (ITO layer) or tin oxide layer (Nesa layer), will undergo a property change and the liquid crystal itself will undergo electrolysis and will be degraded. In the case of an electrochromic device, the electrode will be worn for the same reasons and the electrochromic material such as tungsten oxide or molybdenum oxide will be electrically corroded and undergo a property change, whereby the device will be degraded. Likewise, in the case of an electric field luminance device, the alkali metal ions leached out of the glass surface penetrate through the electroconductive layer and diffuse into the phosphor material, whereby the luminance efficiency and the colour of the luminance will be changed. Further, in the case of an amorphous solar cell, the alkali metal ions leached out of the electrodes are likely to diffuse into the amorphous silicon thereby to reduce the conversion efficiency.

Further, an alkali-containing glass material such as soda lime silica glass has a tendency such that when subjected to a high temperature treatment, the alkali metal ions readily move, and accordingly, there is a drawback such that during the high temperature treatment for the production of electroconductive glass materials or various coated glass materials, the alkali ions readily diffuse whereby the properties of the electroconductive layers or various coated layers will be degraded.

In general, there are three different methods for solving the above mentioned drawbacks of glass plates. One of them is to use a glass plate having a composition which is free from diffusion of alkali metal ions, such as silica glass, high silica glass (Vycor glass), non-alkali-containing aluminum silicate glass (such as CGW #7059), lower-alkali borosilicate (such as Pyrex glass). However, these glass materials are expensive and not necessarily readily available, and they are inferior in the surface smoothness, and accordingly its surface is required to be repolished. In fact, in an extreme case, they are not available in a thin glass plate, and therefore it will be necessary to grind them to obtain a plate having a thickness of a few millimeters and further to polish the plate to obtain a glass plate having a thickness of 1 mm. This is undesirable with a view to conservation of the material resource and energy.

The second method is to preliminarily remove or reduce the alkali component from the surface layer of soda lime silica glass. There are proposed a method in which the surface layer is brought in contact with sulfur at a high temperature, a method in which the glass material is heated in vacuum to a high temperature of at least 300° C. and a direct current electric field is applied to drive the Na+ ions toward the opposite side to provide alkali-deficient surface on which the ITO (Nesa) coating is applied, or a method in which the glass material is boiled in an acid such as hydrochloric acid or sulfuric acid. This method is disadvantageous in that it takes a long time for the operation and the reproducibility is inadequate.

The third method is to form on the surface of soda lime silica glass a certain thin layer for preventing diffusion of alkali metal ions. It is usual for use a silica layer. The reason for using an silicon oxide layer (e.g. $SiO_2$ layer) for the prevention of the diffusion of alkali metal ions is that the layer is amorphous and when another thin layer such as an electroconductive layer is to be formed thereon, it is possible to form substantially the same layer as formed on glass, and the reflactive index of the silicon oxide layer is similar to that of glass although it is slightly less than the reflactive index of glass. Further, the silicon oxide layer usually is transparent against a wider range of lights than the glass plate, and accordingly the transparency of the glass plate will not thereby be impaired. The silicon oxide layer mentioned above is meant in a broad sense, and more specifically, it includes a pure silicon oxide layer and a silicon oxide layer containing a proper amount of impurities, for instance, a silicon oxide layer incorporated with a small amount of boron or phosphorus to improve the ability to prevent the diffusion of alkali metal ions. As representative methods for forming such as an alkali diffusion-preventing silicon oxide layer, there may be mentioned a method in which a silicon oxide layer of e.g. pure $SiO_x$ ($0 < x \leq 2$) is formed by sputtering, vacuum vapour deposition, CVD process or ion-plating process under a high vacuum condition so that the layer is formed as dense as possible to increase the ability to prevent the alkali diffusion, a method in which a pure silicon oxide layer as above is formed by a sol/gel process, and a method in which a boron-containing silicon oxide layer or a phosphorus-containing silicon oxide layer is formed by a sol/gel process whereby an additive such as boron or phosphorus can readily be incorporated.

Alkali diffusion-preventing silicon oxide layers formed by such various methods have certain effectiveness for preventing the diffusion of alkali metal ions although the degree of the effectiveness varies. However, the effectiveness is not usually sufficient, and there is a further drawback that the property varies considerably depending upon the manner and the conditions for their preparation.

SUMMARY OF THE INVENTION

The present inventors have conducted an extensive research to develop an alkali diffusion-preventing silicon oxide layer which is free from the various drawbacks inherent to the above mentioned conventional alkali diffusion-preventing layers, such as severe requirements for the control of the production conditions, the control of the composition and the adjustment of the starting materials and which has a higher alkali diffusion-preventing effectiveness than the conventional alkali diffusion-preventing layers, and as a result, have found that when hydrogen bonded to silicon (Si) is present in the silicon oxide layer, i.e. when —Si—H bonds are introduced to parts of the —O—Si—O—bonds in the silicon oxide layer, it is thereby possible to better prevent the diffusion of alkali metal ions in glass than by the boron or phosphorus-containing silicon oxide layer which is known to have a good alkali diffusion-preventing effectiveness. Thus, the present invention has been accomplished.

Namely, the present invention provides a glass body comprising an alkali-containing glass substrate and a silicon oxide layer formed on its surface for preventing diffusion of alkali metal ions from the glass substrate, which is characterized in that said silicon oxide layer contains hydrogen bonded to silicon.

DETAILED DESCRIPTION OF THE PREFERRED EMBODIMENTS:

The reason why the ability to prevent the diffusion of alkali metal ions from the glass substrate is improved by the alkali diffusion-preventing silicon oxide layer of the present invention, has not yet been clearly understood. However, it is considered that the network structure of the silicon oxide layer is refined or the structural defects are eliminated by the incorporation of —Si—H bonds to parts of the —O—Si—O—bonds in the silicon oxide layer, and the terminal H is positively charged to prevent the outward movement of alkali metal ions such as Na+ and K+, whereby the alkali metal ions are prevented from leaching out of the glass substrate to its surface by the difference in the concentration from the material coated on its surface or by an electric force.

In the present invention, the content of the hydrogen bonded to silicon in the alkali diffusion-preventing silicon oxide layer is preferably from 0.01 to 25 mole %, more preferably from 0.1 to 22 molar %. The presence of such Si-H bonds can be ascertained, for instance, by an infrared spectrophotometry. The relation between the Si-H bonds and the amounts of the alkali diffusion was investigated by this measuring method, and as a result, it has been found that a superior alkali diffusion preventive ability is obtained when the hydrogen content is from 0.01 to 25 mole %, as mentioned above. If the hydrogen content exceeds 25 mole %, the hardness of the alkali diffusion-preventing silicon oxide layer is lowered and the layer becomes susceptible to scars or scratching, such being undesirable. For instance, when the alkali diffusion-preventing silicon oxide layer is applied to a transparent electrode of the display device, it is undesirable that the handling during the process for the preparation becomes difficult because of the reduction of the hardness of the layer. On the other hand, if the hydrogen content is less than 0.01 molar %, the alkali diffusion-preventing ability tends to be inadequate.

In the silicon oxide layer, hydrogen may be present in a form of $H_2$ in addition to the hydrogen bonded to silicon. However, the hydrogen content in the silicon oxide layer for the purpose of the present invention is meant for the content of the hydrogen bonded to silicon, i.e. the hydrogen content in a form of Si-H bonds.

The thickness of the alkali diffusion-preventing silicon oxide layer of the present invention is preferably at least 50 Å in order to obtain an adequate alkali diffusion-preventing ability. It is practically most advantageous that the thickness is within a range of from 100 to 5,000 Å.

As glass materials to which the alkali diffusion-preventing silicon oxide layer of the present invention may be applied, there may be mentioned not only the most commonly used soda lime silica glass containing from 10 to 20% by weight of Na or K, but also various other alkali-containing glass materials.

As a method for forming the alkali diffusion-preventing silicon oxide layer of the present invention, there may be employed a PVD method such as a vacuum vapour deposition method, a sputtering method, or an ion plating method, a CVD method, a reduced pressure CVD method, a sol/gel method or various other layer-forming methods. In the case of the PVD method, $SiO_2$ may be used as the vapour deposition source or target, or Si or SiO is used as the vapour deposition source or target whereby it is coated by reactive vapour deposition or reactive sputtering. As a method for introducing hydrogen into the silicon oxide coating layer, in the case of the PVD method such as the vacuum vapour deposition method, the sputtering method or the ion plating method, there may be mentioned a method in which hydrogen gas or gas of a hydrogen compound is introduced in the vacuum chamber so that Si—H bonds are formed during the formation of the coating layer, or in the case of the CVD method, there may be mentioned a method in which hydrogen gas or gas of a hydrogen compound is brought in contact with gas of a silicon compound capable of forming silicon oxide so that Si-H bonds are thereby formed. As other methods, there may be mentioned a method in which after forming the silicon oxide layer, the layer is subjected to heat treatment in a hydrogen atmosphere, and a method in which after forming the silicon oxide layer, hydrogen ions are introduced thereto by ion bombardment.

The alkali diffusion-preventing silicon oxide layer of the present invention differs from the conventional alkali diffusion-preventing layers in that it is amorphous and does not contain additives in a form of solid components as in the conventional alkali diffusion-preventing silicon oxide layers incorporated with the additives, and Si-H bonds are partly incorporated in the three dimensional network structure. Thus, since the alkali diffusion-preventing silicon oxide layer of the present invention does not contain solid additives, the operation at the stage of preparing the starting materials can readily be made, and during the layer-forming operation, there will not be any troubles such as fractionation which is likely to take place in the case of the vacuum vapour deposition, or scattering of the additives which is likely to occur in the case of sputtering. Thus, the layer-forming operation can thereby be facilitated.

Now, the present invention will be described in further detail with reference to Examples.

EXAMPLE 1

A usual glass plate (i.e. a sode lime silica glass plate) of 10 cm×10 cm×3 mm containing 15% by weight of an alkali component $R_2O$ (R: Na, K) was thoroughly washed with a detergent, then washed with water and dried. This glass plate was placed in a vacuum chamber of a vacuum vapour deposition apparatus, and the chamber was evacuated to a pressure of $1\times10^{-5}$ torr. Then, argon gas containing 15% of hydrogen gas was introduced to bring the pressure to $2\times10^{-4}$ torr. The introduced gas was ionized by application of a high frequency electromagnetic field (frequency : 13.56 MHz), while the vapour deposition source ($SiO_2$ powder) was heated by an electron beam heating method, and a $SiO_2$ layer having a thickness of about 1,000 Å was formed by the high frequency ion plating method at a vapour deposition speed of about 10 Å/sec. Then, dried air was introduced from a variable leak valve into the vacuum chamber to bring the pressure to $3\times10^{-3}$ torr. Therefore, a $SnO_2$ electroconductive layer having about 2,000 Å was formed by the usual vacuum vapour deposition method using as the vapour deposition source tin oxide added with antimony oxide. During the formation of the $SiO_2$ layer and the $SnO_2$ layer, the distance between the vapour deposition source and the glass substrate was 40 cm and the temperature of the substrate was room temperature.

The hydrogen content and the alkali diffusion-preventing ability of the sample 1 thus obtained are shown in Table 1.

EXAMPLE 2

A glass plate similar to the one used in Example 1 was thoroughly washed with a detergent, then washed with water and dried. This glass plate was placed in a vacuum chamber of a RF diode sputtering apparatus, and the chamber was evacuated to a pressure of $1\times10^{-5}$ torr. Then, argon gas containing 15% of hydrogen gas was introduced thereto to bring the pressure to $3\times10^{-2}$ torr. A $SiO_2$ layer having a thickness of about 1,000 Å was formed by the RF diode sputtering method using a molten quartz target. Then, the glass substrate having the $SiO_2$ layer thus formed, was transferred to a vacuum deposition apparatus, and the vacuum chamber was evacuated to $3\times10^{-4}$ torr. Then, a $SnO_2$ electroconductive layer having a thickness of about 2,000 Å was formed by a usual vacuum vapour deposition method using as the vapour deposition source tin oxide added with antimony oxide. The temperature of the glass substrate at the time of the sputtering was about 300° C. and the temperature of the glass substrate at the time of the vapour deposition of $SnO_2$ was room temperature.

The hydrogen content and the alkali diffusion-preventing ability of the sample 2 thus obtained are shown in Table 1.

EXAMPLE 3

A glass plate similar to the one used in Example 1 was thoroughly washed with a detergent, then washed with water and dried. This glass plate in a vacuum chamber of a RF magnetron sputtering apparatus, and the chamber was evacuated to a pressure of $1\times10^{-5}$ torr. Then, argon gas containing 15% of hydrogen gas was introduced thereto to bring the pressure to $3\times10^{-3}$ torr. A $SiO_2$ layer having a thickness of about 1,000 Å was formed by the RF magnetron sputtering method using a molten quartz target. Then, the glass substrate having the $SiO_2$ layer thus formed, was transferred to a vacuum vapour deposition apparatus, and the vacuum chamber was evacuated to $3\times10^{-4}$ torr, and a $SnO_2$ electroconductive layer having a thickness of about 2,000 Å was formed by the usual vacuum vapour deposition method using as the vapour deposition source tin oxide added with antimony oxide. The temperature of the glass substrate at the time of the sputtering was about 300° C. and the temperature of the glass substrate at the time of the vapour deposition was room temperature.

The hydrogen content and the alkali diffusion-preventing ability of the sample 3 thus obtained are shown in Table 1.

EXAMPLE 4

A glass plate similar to the one used in Example 1 was thoroughly washed with a detergent, then washed with water and dried. A $SiO_2$ layer having a thickness of about 1,000 Å was formed on the glass plate surface by the CVD method using $SiH_4$ gas and $O_2$ gas at the substrate temperature (Ts) of 300° C., 400° C., 450° C. or 550° C. The ratio (R) of $O_2/SiH_4$ was about 10, 40 or 60. Then, each glass substrate having the layer thus formed was placed in a vacuum chamber of a vacuum vapour deposition apparatus, and the chamber was evacuated to a pressure of $3\times10^{-4}$ torr. Then, a $SnO_2$ electroconductive layer having a thickness of about 2,000 Å was formed by the usual vacuum vapour deposition method using as the vapour deposition source tin oxide added with antimony oxide. The temperature of the glass substrate at the time of the vapour deposition was room temperature.

Among the four samples thus obtained, the one in which the $SiO_2$ layer was formed at Ts=300° C. and R=10 was designated as sample 4, the one in which the $SiO_2$ layer was formed at Ts=400° C. and R=10 was designated as sample 5, the one in which the $SiO_2$ layer was formed at Ts=450° C. and R=10 was designated as sample 6, and the one in which the $SiO_2$ layer was formed at Ts=550° C. and R=10 was designated as sample 7. Similarly sample 8 : (Ts=300° C., R=40), sample 9 : (Ts=400° C., R=40), sample 10: (Ts=450° C., R=40), sample 11 : (Ts=550° C., R=40), sample 12 : (Ts=300° C., R=60), sample 13 : (Ts=400° C., R=60), sample 14 : (Ts=450° C., R=60), sample 15 : (Ts=550° C., R=60).

The hydrogen content and the alkali diffusion-preventing ability of each of these samples are shown in Table 1.

COMPARATIVE EXAMPLE 1

A glass plate similar to the one used in Example 1 was thoroughly washed with a detergent, then washed with water and dried. This glass plate was placed in a vacuum chamber of a vacuum vapour deposition apparatus, and the chamber was evacuated to a pressure of $5\times10^{-5}$ torr. Then, the vapour deposition source ($SiO_2$ powder) was heated by the electron beam heating method, and a $SiO_2$ layer having a thickness of about 1,000 Å was formed by the usual vacuum vapour deposition method at the vapour deposition speed of about 10 Å/sec. Then, dried air was introduced from a variable leak valve into the vacuum chamber to bring the pressure to $3\times10^{-3}$ torr. Then, a $SnO_2$ electroconductive layer having a thickness of about 2,000 Å was formed by the usual vacuum vapour deposition method using as the vapour deposition source tin oxide added with antimony oxide. The distance between the vapour deposition source and the glass substrate during the formation of the $SiO_2$ layer and the $SnO_2$ layer was 40 cm, and the substrate temperature was room temperature.

The hydrogen content and the alkali diffusion-preventing ability of the sample 16 thus obtained are shown in Table 1.

COMPARATIVE EXAMPLE 2

A glass plate similar to the one used in Example 1 was thoroughly washed with a detergent, then washed with water and dried. This glass plate was placed in a vacuum chamber of a RF bipolar sputtering apparatus, and the chamber was evacuated to a pressure of $1\times10^{-5}$ torr. Then, argon gas was introduced to bring the pressure to $3\times10^{-3}$ torr. A $SiO_2$ layer having a thickness of about 1,000 Å was formed by the RF bipolar sputtering method using a molten quartz target. Then, the glass substrate having the $SiO_2$ layer thus formed, was transferred to a vacuum vapour deposition apparatus, and the vacuum chamber was evacuated to a pressure of $3\times10^{-4}$ torr. Then, a $SnO_2$ electroconductive layer having a thickness of about 2,000 Å was formed by the usual vacuum vapour deposition method using as the vapour deposition source tin oxide added with antimony oxide. The temperature of the glass substrate at the time of the sputtering was about 300° C. and the temperature of the glass substrate at the time of the vapour deposition was room temperature.

The hydrogen content and the alkali diffusion-preventing ability of the sample 17 thus obtained are shown in Table 1.

COMPARATIVE EXAMPLE 3

A glass plate similar to the one used in Example 1 was thoroughly washed with a detergent, then washed with water and dried. This glass plate was placed in a vacuum chamber of a vacuum vapour deposition apparatus, and the chamber was evacuated to a pressure of $3\times10^{-3}$ torr. While heating the vapour deposition source of tin oxide added with antimony oxide by the electron beam heating method, a $SnO_2$ electroconductive layer having a thickness of about 2,000 Å was formed by the usual vacuum vapour deposition method. During the formation of the $SnO_2$ layer, the distance between the vapour deposition source and the glass substrate was 40 cm and the temperature of the glass substrate was room temperature.

The hydrogen content and the alkali diffusion-preventing ability of the sample 18 thus obtained are shown in Table 1.

TABLE 1

| Sample Nos. | Hydrogen content in the $SiO_2$ layer (%) | Alkali diffusion-preventing ability ($Na_2O$ amount ($\mu g/cm^2$) detected in the $SnO_2$ layer after diffusion treatment at 550° C. for 30 minutes) |
| --- | --- | --- |
| 1 (Example 1) | 0.3 | 1.0 |
| 2 (Example 2) | 1.2 | 0.8 |
| 3 (Example 3) | 2.0 | 0.2 |
| 4 (Example 4, R = 10) | 22.0 | 0.4 |
| 5 (Example 4, R = 10) | 6.0 | 0.1 |
| 6 (Example 4, R = 10) | 2.0 | 0.2 |
| 7 (Example 4, R = 10) | 0.1 | 1.6 |
| 8 (Example 4, R = 40) | 8.0 | 0.1 |
| 9 (Example 4, R = 40) | 3.0 | 0.1 |
| 10 (Example 4, R = 40) | 1.0 | 0.3 |
| 11 (Example 4, R = 40) | 0.1 | 2.0 |
| 12 (Example 4, R = 60) | 4.0 | 0.1 |
| 13 (Example 4, R = 60) | 2.0 | 0.1 |
| 14 (Example 4, R = 60) | 0.8 | 0.8 |
| 15 (Example 4, R = 60) | 0.2 | 3.5 |
| 16 (Comparative Example 1) | 0 | 4.5 |
| 17 (Comparative Example 2) | 0 | 5.1 |
| 18 (Comparative Example 3) | 0 | 12.1 |

The hydrogen content (%) in the $SiO_2$ layer shown in the above Table was obtained by an infrared spectrophotometry as a content of hydrogen in the form of Si—H bonds in the $SiO_2$ layer. The alkali diffusion-preventing ability was evaluated by the amount of the alkali leaked through the $SiO_2$ layer. The measuring method comprised subjecting each sample to heat treatment at 550° C. for 30 minutes to facilitate the diffusion of the alkali from the glass substrate, then dissolve the $SnO_2$ surface layer with an etching solution of HCl+Zn and measuring sodium dissolved and contained in the etching solution by an atomic absorption method.

It is seen from the above Table that the glass body provided with an alkali diffusion preventing silicon oxide layer according to the present invention in which hydrogen bonded to silicon was introduced in the silicon oxide layer, is capable of preventing the leaching out of the alkali more effectively than the silicon oxide layer into which no such hydrogen was introduced. It has the effectiveness equal to or greater than the effectiveness of the phosphorus-containing $SiO_2$ layer formed by a sol/gel method and which has been believed to be most effective in the alkali diffusion-preventing capability among the conventional layers.

The glass body provided with an alkali diffusion-preventing silicon oxide layer according to the present invention can readily be prepared with minimum restrictions in the process and conditions of its production and yet provides a high alkali diffusion-preventing ability.

Further, the glass body provided with an alkali diffusion-preventing silicon oxide layer according to the present invention has adequate hardness, secure bonding between the glass substrate and the silicon oxide layer, light stability, and thermal stability up to about 600° C., and it is adequately stable in various environmental conditions and processing conditions.

The glass body provided with the alkali diffusion-preventing silicon oxide layer according to the present invention is particularly suitable for use as an alkali diffusion-preventing layer of an electroconductive glass to be used for display devices such as a liquid crystal device, an electrochromic device and an electric field luminance device or an amorphous solar cell substrate. It is stable and durable under the conditions for the production of such display devices or solar cell or under various environmental conditions for its use.

The present invention is also useful for other purposes, for instance, to form an under coat on a glass plate in a case where an electroconductive layer, a heat radiation reflection preventive layer, a reflecting layer, a coloured layer or a layer having various other functions is to be formed on the glass plate for automobiles, aircrafts, rail way vehicles or other transportation vehicles, constructions, various apparatus, optical devices, electric devices or electronic devices.

We claim:

1. A glass body comprising an alkali-containing glass substrate and a silicon oxide layer formed on its surface for preventing diffusion of alkali metal ions from the glass substrate, wherein the silicon of said silicon oxide layer contains essentially O—Si—O and Si—H bonds and where said hydrogen is bonded to silicon in the amount of 0.01 to 25 molar %.

2. The glass body according to claim 1 wherein the content of the hydrogen bonded to silicon in the silicon oxide layer is from 0.1 to 22 molar %.

* * * * *